United States Patent [19]

Burke

[11] Patent Number: 4,987,374
[45] Date of Patent: Jan. 22, 1991

[54] FSK DEMODULATOR

[76] Inventor: Dennis E. Burke, 3N455 Crown Rd., Elmhurst, Ill. 60126

[21] Appl. No.: 417,375

[22] Filed: Oct. 5, 1989

[51] Int. Cl.$^5$ ............................................. H03D 3/00
[52] U.S. Cl. ................................... 329/302; 329/323; 375/80; 375/88
[58] Field of Search ............... 329/300, 302, 303, 323; 375/80, 82, 88, 89, 90, 91, 111

[56] References Cited

U.S. PATENT DOCUMENTS 4,583,048  4/1986  Gumacos et al. .................... 529/302

*Primary Examiner*—David Mis
*Attorney, Agent, or Firm*—Wayne J. Egan

[57] ABSTRACT

An improved multilevel FSK demodulator, according to the invention, is provided that down-converts the IF frequency back to baseband quadrature via dual mixers. The improved multilevel FSK demodulator uses time-delay demodulation. This method requires a ±90° phase difference between 2 modulated signals to produce a maximum demodulated output amplitude at the maximum frequency deviation. Since the IF frequencies have been down-converted back to baseband quadrature, these 2 signals are only "out of phase" by an amount $\Delta t$ that is equal to 90°/dω. For a $\Delta \omega$ of 4 MHz, this gives a $\Delta t = 62.5$ nonoseconds. As a result, it is easy to achieve a delay line using multiple tap positions for 62.5 nonoseconds total delay.

11 Claims, 2 Drawing Sheets

FSK DEMODULATOR

TECHNICAL FIELD

This invention pertains to FM demodulators and more particularly to FSK demodulators using time-delay demodulation.

BACKGROUND OF THE INVENTION

It is known that traditional quadrature FM detectors are used in FM receiver IF stages to demodulate two-tone and multilevel FSK signalling. This method is successful because a quadrature FM demodulator detects the difference between an input IF signal frequency and a fixed center frequency tuned by a bandpass filter.

It is also known that a frequency and phase-locked loop (FPLL) may be used to detect the difference between two signals—the input signal and the output of a VCO. This new type of frequency difference detector is a quadrature FM detector that has had a "bandpass-to-lowpass" transformation performed on it.

The idea of configuring an FM demodulator in a "zero IF" form is to utilize the "bandpass-to-lowpass" transformation to the advantage that "drift" of the bandpass center tuning filter can be eliminated. As a result, the discriminator's characteristic "S" curve is now solely dependent on the phase characteristic of the low pass filter, which is now designed at "baseband" frequencies. Proper design of this LPF can produce the required "S" curve. Essentially, the whole FSK demodulator (two-tone or multilevel) could be designed as a fast-acquisition FPLL, but it might be easier to use just the frequency difference detector to create a zero-IF signal, ready for demodulation by baseband components operating in an open-loop mode.

As a result, it has been proposed that the VCO be replaced with a crystal-controlled oscillator. This double-mixer concept will produce 2 signals that are in phase quadrature, but converted down to baseband.

One advantage of using baseband signals that are time-delayed to demodulate an FSK signal is that the time-delay element, to wit, the LPF, may be replaced with a digital equivalent. This digital equivalent may be implemented as a tapped delay line with selectable taps. If this is done directly at the IF frequency (traditional IFs could be in the low VHF band), the period of the IF waveform would be only a few nanoseconds. For example, the period of a 70 MHz IF signal is only 14.2857 nanoseconds. The time-delay FSK demodulation method requires a ±90° phase difference between 2 modulated signal paths to produce a maximum demodulated output amplitude at the maximum frequency deviation. Hence, these 2 signals are only "out of phase" by 3.5714 nanoseconds. As a result, it is difficult to achieve multiple tap positions over only 3.57 nanoseconds total delay. Obviously, it would be desirable to provide an improved multilevel FSK demodulator.

SUMMARY OF THE INVENTION

It is an object of the invention to provide an improved multilevel FSK demodulator. Accordingly, an improved multilevel FSK demodulator, according to the invention, is provided that down-converts the IF frequency back to baseband quadrature via dual mixers. The improved multilevel FSK demodulator uses time-delay demodulation. This method requires a ±90° phase difference between 2 modulated signals to produce a maximum demodulated output amplitude at the maximum frequency deviation. Since the IF frequencies have been down-converted back to baseband quadrature, these 2 signals are only "out of phase" by an amount $\Delta t$ that is equal to $90°/d\omega$. For a $d\omega$ of 4 MHz, this gives a $\Delta t = 62.5$ nanoseconds. As a result, it is easier to achieve a delay that is adjustable about 90 degrees using a delay line with multiple tap positions to produce 62.5 nanoseconds total delay.

DETAILED DESCRIPTION OF THE INVENTION

Figure 1:
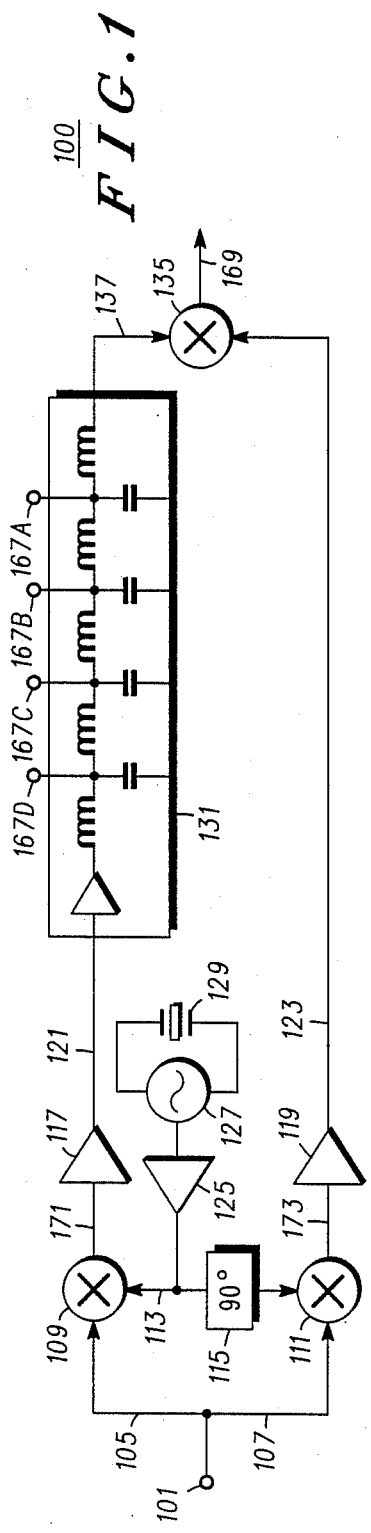
FIG. 1 is a block diagram showing a first embodiment of an FSK demodulator, according to the invention.

Referring to FIG. 1, there is shown a first embodiment 100 of the invention. It is assumed the IF frequency is 70 MHz and the frequency deviation $\Delta\omega = \pm 4$ MHz. As shown, the input IF signal 101 is split into two paths 105 and 107 and input to a first product detector (or multiplier) 109 and a second product detector (or multiplier) 111.

Also shown is an oscillator 127 operating at the IF frequency and controlled by a crystal 129. The oscillator output is isolated by buffer amplifier 125 and then split into two paths. The first path 113 is directly input to the first multiplier 109, while the second path 115 is shifted by 90° and input to the second multiplier 111. It will be appreciated that the first path 113 is equivalent to either shifting the signal by 0° or else by 360°.

The output 171 from the first multiplier 109 is then limited by limiter 117 and the result 121 is input to the delay line 131. The delay line 131 is arranged with multiple taps 167A, 167B, 167C, and 167D which act to adjust the overall delay ($\Delta t$). The output 137 is then input to a third multiplier or product detector 135.

The output 173 from the second multiplier 111 is next limited by limiter 119 and the result 123 input to the third multiplier 135. With this arrangement, the output 169 of the third multiplier 135 comprises the FSK output.

If the maximum deviation $\Delta\omega$ is ±4 MHz, then a suitable initial delay is $(\frac{1}{4})*(1/70 \text{ MHz}) = 62.5$ nanoseconds. As a result, it is easy to get tapped delay lines (such as element 131) with 5 nanosecond delay tap increments.

Figure 2:
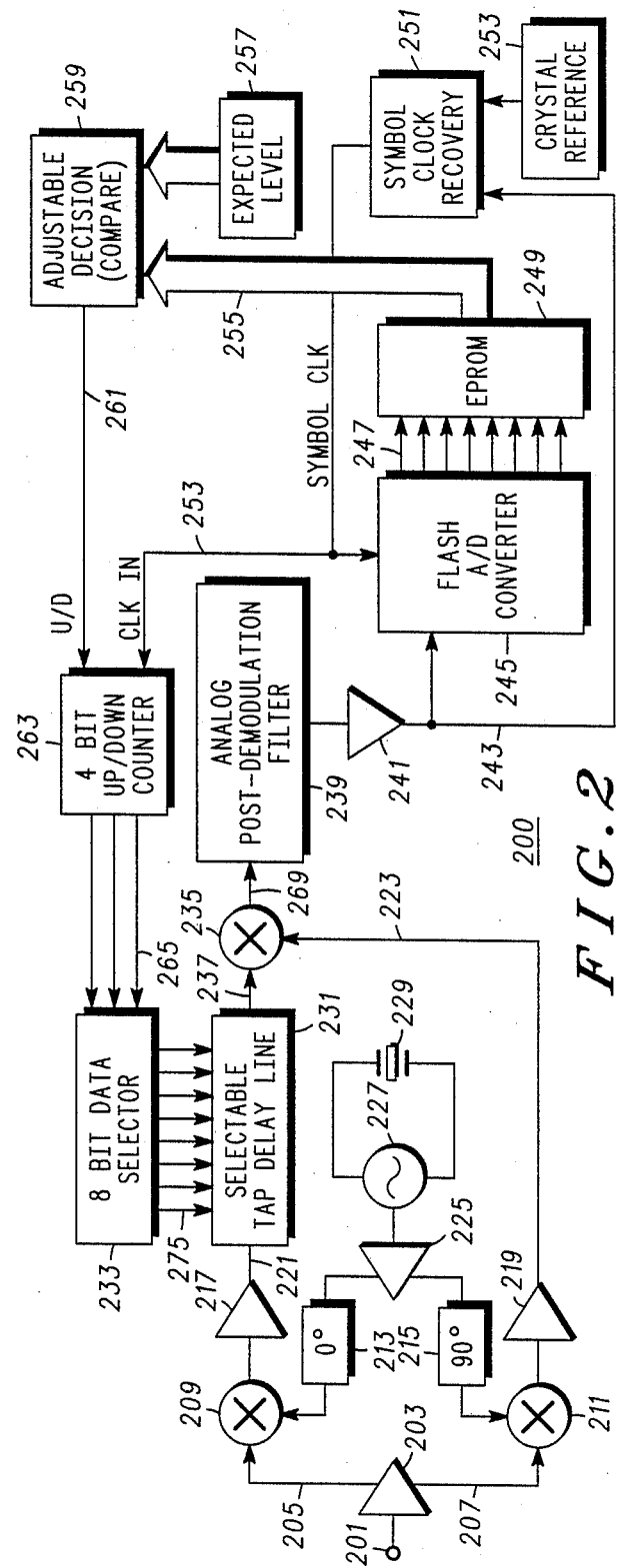
FIG. 2 is a block diagram showing a second embodiment of an FSK demodulator, according to the invention.

Referring to FIG. 2, there is shown a second embodiment 200 of the present invention. It is assumed the IF frequency is 70 MHz and the frequency deviation $\Delta\omega = \pm 4$ MHz. As shown, the input IF signal 201 is split into two paths 205 and 207 and input to a first product detector or multiplier 209 and a second product detector 211.

Also shown is an oscillator 227 operating at the IF frequency and controlled by a crystal 229. The oscillator output is isolated by buffer amplifier 225 and then split into two paths. The first path 213 is shifted by 0° or else by 360° and then input to the first multiplier 209, while the second path 215 is shifted by 90° and input to the second multiplier 211.

The output from the first multiplier 209 is then limited by limiter 217 and the result 221 is input to the delay line 231. The delay line 131 is arranged with multiple taps 275, which act to adjust the over-all delay ($\Delta t$). The output 237 is then input to a third multiplier or product detector 235.

The output from the second multiplier 211 is next limited by limiter 219 and the result 223 is input to the third multiplier 235. With this arrangement, the output 269 of the third multiplier 235 comprises the FSK output.

The output 269 of the third multiplier must be filtered by 239 to remove high frequency mixing products, and to "shape" the received signal pattern such that intersymbol interference due to communication channel non-linearities is reduced.

Amplifier 241 is used to bring the demodulated symbol information to the correct analog level such that it may be digitized by the fast (flash) video A/D converter 245. The symbol signal path 243 feeds into a clock recovery network 251, whose purpose is to line up the phase of the crystal reference 253 with that special portion of the symbolized information "packet". Network 251 must sample a special "header" symbol sequence to determine the phase of the incoming demodulated symbols. The synchronization process guarantees that the fast (flash) video A/D converter 245 samples the symbol at the correct time slot.

The outputs 247 of the fast (flash) video A/D converter 245 (typically, MC10321) are the n-bit digitized value of the demodulated FSK symbol, with each level of the multilevel signalling characterized by a distinct symbol. Stored in EPROM 249 are the digital bit stream equivalents corresponding to the 2 to the nth addresses. The parallel bit stream 255 is fed to a decision circuit 259 that takes this incoming data and compares the bits with a special bit pattern stored in block 257. This stored pattern, known as a "preamble", equates to only those bit sequences that identify the n-level symbols.

The output of decision circuit 259 is a logic level on line 261 indicating to 4-bit UP counter 263 (typically 74F169) that it should count UP or DOWN at the symbol rate, fed into 263 at its clock input via line 253. As shown in FIG. 2, a data selector 233 (8 bit in this case, typical 74F251)) takes the count from 263, and determines which tap, via lines 275, to be selected in adjustable delay line 231. This adjustment process takes place for as long as the preamble signal pattern is sent to the demodulator circuit. To those skilled in the art, it will be realized that the final value selected for the tap on the delay line will remain the same during the remainder of the typically short burst transmissions.

It will be appreciated by those skilled in the art that this embodiment permits digital selection of the adjustable tap delay line 231, thereby allowing for the implementation in a feedback scheme so that the demodulation sensitivity can be automatically corrected for those systems relying on accurate demodulated information amplitude, to wit, multilevel FSK signalling. This embodiment would also allow for parameter variations, since the chosen delay value may change over environmental changes, so that a new value tap would be selected to compensate for these variations. The "finetuning" is based on the number of taps used and the incremental time delay provided by each tap position.

Another advantage of the digitally-selectable tap, over the low pass filter time delay, is that the delay through the analog low pass filter is not constant as a function of frequency. In other words, $\Delta\theta/\Delta\omega \neq$ (fixed)$\tau_d$ unless the filter were special and costly. With the tap delay line, the chosen $\Delta\theta/\Delta\omega$ is constant over the deviation band (baseband bandwidth).

While various embodiments of an improved multilevel FSK demodulator, according to the invention, are disclosed herein, the scope of the invention is defined by the following claims.

What is claimed is:

1. A detector (100) for an FM-modulated IF signal having a frequency deviation $\Delta\omega$, comprising:
   splitting means for providing the IF signal to a first input (105) of a first product detector (109) and to a first input (107) of a second product detector (111),
   oscillator means (127) for providing a signal at the IF frequency to the input of a 90° phase shift means (115) and to the input of a 0° or 360° phase shift means (113),
   the 90° phase shift means output signal coupled to a second input of said second product detector (111),
   the 0° or 360° phase shift means output signal coupled to a second input of said first product detector (109),
   said first product detector output (171) coupled to the input (121) of a time-delay means (131) having a time-delay $\Delta t$ that is based on the quotient (90°/$\Delta\omega$),
   the time-delay means output (137) coupled to a first input of a third product detector (135),
   said second product detector output (173) coupled to a second input (123) of said third product detector (135).

2. The detector of claim 1, said oscillator means including a crystal-controlled oscillator.

3. The detector of claim 2, said oscillator means including a buffer means connected in series with said oscillator.

4. A detector (200) for an FM-modulated IF signal having a frequency deviation $\Delta\omega$, comprising:
   splitting means (203) for providing the IF signal to a first input (205) of a first product detector (209) and to a first input (207) of a second product detector (211),
   oscillator means (227) for providing a signal at the IF frequency to the input of a 90° phase shift means (215) and to the input of a 0° or 360° phase shift means (213),
   the 90° phase shift means (215) output signal coupled to a second input of said second product detector (211),
   the 0° or 360° phase shift means (213) output signal coupled to a second input of said first product detector (209),
   said first product detector (209) output coupled to the input (221) of a time-delay means (231) having a time-delay $\Delta t$ that is based on the quotient (90°/$\Delta\omega$),
   the time-delay means output (237) coupled to a first input of a third product detector (237),
   said second product detector (211) output coupled to a second input of said third product detector (235),
   said third product detector output (269) coupled to a converter means (239, 241, 245) for sampling said output at the symbol rate, and for providing a digital form of the sampled signal to a processor means,
   said processor means (249, 251, 253, 257, 259) having means for computing the desired value of said time-delay means, and means (263, 233) coupled to said time-delay means (231) for adjusting said setting to said desired value.

5. The detector of claim 4, said oscillator means including a crystal-controlled oscillator (229).

6. The detector of claim 5, said oscillator means including a buffer means (225) connected in series with said oscillator.

7. The detector of claim 6, said converter means including an A/D converter (245).

8. The detector of claim 7, said time-delay means including a multiplicity of taps (275) for adjusting the setting.

9. The detector of claim 8, said processor means including a multiplicity (N) of bit lines (247) coupled from said A/D converter (245) to the inputs of an addressable EPROM (249), said EPROM's outputs coupled to a digital comparator (259) arranged to compare said outputs with an expected pattern (257), the output (261) of said comparator coupled to an up/down counter (263), the outputs (265) of said up/down counter coupled to said multiplicity of taps (275) of said time-delay means (231).

10. A method for detecting an FM-modulated IF signal having a frequency deviation $\Delta\omega$, comprising:
(a) providing a detection signal at the IF center frequency of the received signal;
(b) providing a first version of said detection signal that is phase-shifted by 90°;
(c) providing a second version of said detection signal that is phase-shifted by 0° or 360°;
(d) forming a first signal based on the product of said first version and said IF signal;
(e) forming a second signal based on the product of said second version and said IF signal;
(f) time-delaying said first signal by a $\Delta t$ based on the quotient ($90°/\Delta\omega$), thereby forming a delayed first signal;
(g) forming an output signal based on the product of said delayed first signal and said second signal.

11. An FSK demodulator for detecting an FM-modulated IF signal having a frequency deviation $\Delta\omega$, comprising:
means for providing a detection signal at the IF center frequency of the received signal;
means for providing a first version of said detection signal that is phase-shifted by 90°;
means for providing a second version of said detection signal that is phase-shifted by 0° or 360°;
means for forming a first signal based on the product of said first version and said IF signal;
means for forming a second signal based on the product of said second version and said IF signal;
means for time-delaying said first signal by a $\Delta$ based on the quotient ($90°/\Delta\omega$), thereby forming a delayed first signal;
means for forming an output signal based on the product of said delayed first signal and said second signal.

* * * * *

UNITED STATES PATENT AND TRADEMARK OFFICE
CERTIFICATE OF CORRECTION

PATENT NO. : 4,987,374

DATED : 01/22/91

INVENTOR(S) : Dennis E. Burke

It is certified that error appears in the above-identified patent and that said Letters Patent is hereby corrected as shown below:

In the Abstract:

In line 12, "nonoseconds" should be --nanoseconds--.

In line 14, "nonoseconds" should be --nanoseconds--.

Signed and Sealed this

Ninth Day of June, 1992

Attest:

DOUGLAS B. COMER

*Attesting Officer*   Acting Commissioner of Patents and Trademarks